United States Patent [19]

Sim

[11] Patent Number: 4,747,532
[45] Date of Patent: May 31, 1988

[54] APPARATUS FOR HOLDING ELECTRICAL OR ELECTRONIC COMPONENTS DURING THE APPLICATION OF SOLDER

[75] Inventor: Ah T. Sim, Block, Singapore

[73] Assignee: Sun Industrial Coatings Private Ltd., Jurong, Singapore

[21] Appl. No.: 897,824

[22] Filed: Aug. 19, 1986

[30] Foreign Application Priority Data

Aug. 20, 1985 [GB] United Kingdom ............... 8520844

[51] Int. Cl.⁴ .............................................. B23K 37/04
[52] U.S. Cl. ..................................... 228/47; 269/903; 269/37; 118/503; 211/132
[58] Field of Search ................. 228/47, 36, 37, 39, 228/40; 269/903, 37, 237, 43, 209; 118/503; 211/4, 8, 9, 132, 126, 168

[56] References Cited

U.S. PATENT DOCUMENTS

| | | | |
|---|---|---|---|
| 3,223,406 | 12/1965 | Traeger | 269/903 |
| 4,473,455 | 9/1984 | Dean et al. | 269/903 |
| 4,489,923 | 12/1984 | Barressi et al. | 269/903 |
| 4,527,620 | 7/1985 | Pedersen et al. | 269/903 |
| 4,556,776 | 12/1985 | Duncan | 269/37 |
| 4,677,937 | 7/1987 | Tee | 118/503 |

FOREIGN PATENT DOCUMENTS

| | | | |
|---|---|---|---|
| 2495884 | 6/1982 | France | 118/503 |
| 51-27845 | 3/1976 | Japan | 228/36 |
| 53-42027 | 11/1978 | Japan | 228/37 |

OTHER PUBLICATIONS

IBM Technical Disclosure Bulletin, vol. 19, No. 9, Feb. '77, p. 3319.

Primary Examiner—Nicholas P. Godici
Assistant Examiner—Samuel M. Heinrich
Attorney, Agent, or Firm—Bacon & Thomas

[57] ABSTRACT

A carrier for components to be soldered includes an upper frame pivotally connected to a lower frame. The upper frame includes longitudinal grid members interlocked with transverse grid members to define recessed zones with stepped corners to locate the components. The lower frame has slidably mounted strips with projections which engage the components when the lower frame is pivoted to a closed condition.

16 Claims, 7 Drawing Sheets

APPARATUS FOR HOLDING ELECTRICAL OR ELECTRONIC COMPONENTS DURING THE APPLICATION OF SOLDER

This specification relates chiefly to apparatus for holding electrical or electronic components, particularly during the application of solder. The apparatus is particularly concerned with holding integrated circuit packs.

In European patent application No. 0171257, which was not published as of the priority date of this application, there is disclosed a carrier for dual-in-line packages in which the packages are slid into tracks with rails which restrict movement in all lateral directions. Once loaded into the carrier, the packages can be subjected to processing steps of e.g. cleaning, rinsing, etching, rinsing, drying, fluxing, pre-heating, wave soldering, fan drying, hot water rinsing, cooling and then unloading. Whilst the carrier disclosed in the above Application is effective in the case of dual-in-line packages, there is a need for a carrier to handle other types of packages.

In particular, there are now becoming increasingly popular, "plastic leadless chip carriers", known as "PLCC's" or "Quad Packs". These are relatively flat, rectangular in plan view, and with contacts on all four sides. The contacts stand slightly proud of one of the major faces of the packs and typically extend from the sides and are bent over a ridge running around the periphery of this face. Current PLCC's available may have 5,7,11,13 or 17 contacts along each side, and are square in plan view.

The presence of the contacts along four sides makes it inconvenient to try to adapt the apparatus disclosed in the above mentioned European Application in which packages are slid along rails and there is thus a need for a different type of carrier for PLCC's and other components which pose similar problems.

Considering primarily means for restricting lateral movement of components, and vertical movement in one direction, from one broad aspect there is disclosed herein apparatus for holding electrical or electronic components, comprising a first set of parallel elongate members and a second set of parallel elongate members intersecting the first set so as to form a grid of a plurality of quadrilaterals, the corners of which are the points of intersection and alternate quadrilaterals in any direction constituting a zone for receiving a component, wherein each of the four members defining such a zone is provided with a pair of facing abutments, one outside each of its points of intersection, so as to resist lateral movement of a component positioned in the zone, and between each such pair of abutments is provided at least one portion to restrict vertical movement in the one vertical directions, the carrier also being provided with means to restrict vertical movement in the other vertical direction.

For the purposes of explanation, it can be assumed that the components are square PLCC's soldered with their contacts facing downwardly, i.e. with the major face having a peripheral ridge, facing downwardly. It will be assumed that upper portions of the four edges are free from contacts and that the upper major face is generally flat. It will also be assumed that the lower major face inside the peripheral ridge is also generally flat. However, it must be appreciated that the broad principles disclosed herein are applicable to other types of component and to other contexts.

It must also be appreciated that whilst "upper" and "lower" may be of significance in the preferred use of the carrier, these or similar expressions are generally for explanatory purposes in defining the construction of the carrier.

For use in the context of the PLCC's described above, two sets of members will intersect at right angles and will define zones which are squares. The total of eight abutments for any zone will engage the upper portions of the edges of any PLCC, with one on each side of each corner. Portions of the members will engage the upper face of the PLCC, and separate means will be provided to engage the lower face.

It is preferable that the area of contact between any member and a component be fairly small since otherwise staining can occur during the various process steps. Thus, in preferred arrangements there are provided two upwardly directed steps between the facing abutments on each member, with the portion of the member between the steps being recessed so as not to contact a component. The steps can extend over only a short length of the member but are preferably as far apart as possible so as to provide the best stability. Conveniently, a step is provided adjacent each abutment and can stop short of the point of intersection of two members. Thus, each member can be provided along its length with a plurality of equally spaced recesses each side of which is stepped, the members intersecting between the steps.

Whilst it is conceivable that the grid could be fabricated from small portions, several of which would constitute one of the elongate members, for all practical purposes it is envisaged that the grid will comprise continuous members which are interlocked. This can be achieved by providing one set of members with downwardly facing slots for half the depth of the members, and the other set of members with upwardly facing slots, again for half the depth of the members.

The members are preferably in the form of relatively thin strips which have sufficient depth to achieve the required rigidity for the grid. They may be constructed from titanium or any other suitable material capable of withstanding the environment of the various process steps. The grid will generally be supported in a frame and the connection between the grid and frame may be such as to allow for a certain degree of thermal expansion.

Considering now primarily means for restricting only vertical movement, which in the preferred apparatus will of course be the opposite direction to that handled by the structure described above, from one broad aspect there is disclosed herein apparatus for holding electrical or electronic components including means for holding a plurality of components in an array and restricting them against movement in lateral directions and in one vertical direction, wherein means for restricting vertical movement in the other vertical direction comprises a plurality of parallel elongage members each provided along its length with a plurality of projections adapated to engage the components and each mounted to a frame by means of a lug and slot arrangement allowing for thermal expansion.

In use with the PLCC's described above, the projections will permit the components to be held in place, whilst the body of each member can be kept clear of the contacts. To reduce the area of contact with the lower major face of the component, each projection should extend over a relatively short length. To improve stability, whilst meeting this requirement, the projections could be grouped in pairs longitudinally so as to be positioned on either side of a component. Additionally or alternatively the projections could be grouped in pairs laterally. Laterally related pairs, to engage the same components, could be provided on a suitably designed single elongate member or by separate members both of which would be mounted to the frame by lug and slot arrangements.

The elongate members are preferably in the form of relatively thin strips although they should have sufficient depth to be rigid. They may be constructed from titanium or any other suitable material capable of withstanding the environment of the various process steps, as may all other components of the apparatus disclosed herein.

In the preferred apparatus, movement in lateral directions and in the said one vertical direction is restricted by means of the grid arrangement described above. With such apparatus, two separate frame portions will be provided—one with the grid in which the components are firstly positioned, and one with the elongate members with projections. The frame portions are then moved together so as to locate the components. The two frame portions may be pivoted and may be locked together by any convenient means.

In the preferred arrangement, the grid provides the upper location and the other arrangement the lower location. The lower system provides easy access for solder to the components. Furthermore, by having the elongate members of this lower system aligned parallel to the relative direction of solder flow and by having them spaced below other frame members, the resistance to flow is reduced. Thus, preferably the elongate members of this system are mounted on posts which project downwardly from the frame members.

For ease of assembly these elongate members may be provided with slots having enlarged portions which can be moved over the heads of the lugs and narrower portions which, on relative movement of the lugs and members during assembly, will locate the members whilst providing sufficient room for thermal expansion. A similar arrangement for locating another type of member is disclosed in the aforementioned European patent application No. 85305437.7.

Some embodiments of apparatus incorporating the above and other broad aspects will now be described by way of example and with reference to the accompanying drawings, in which.

Figure 1:
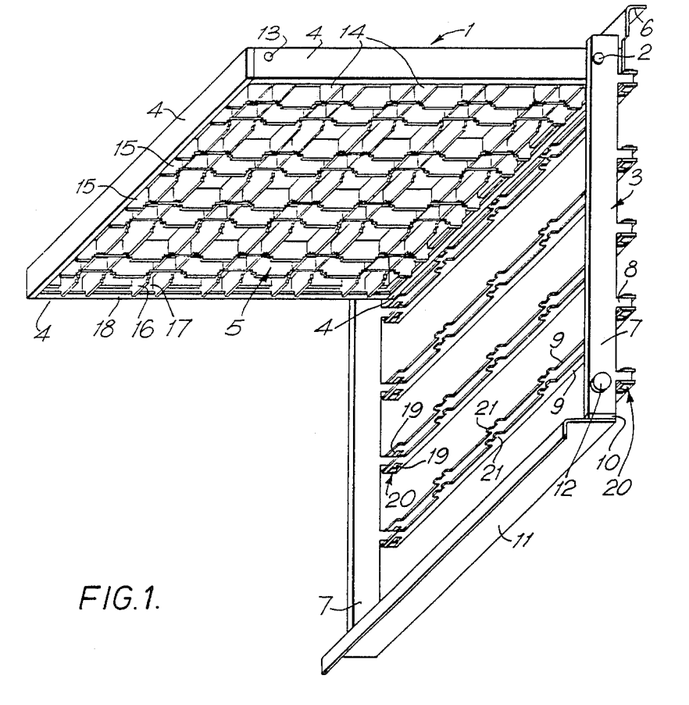
FIG. 1 is an underneath perspective view of a carrier for twenty PLCC's.

Referring now to FIG. 1, the carrier comprises an upper frame 1 which is pivotally connected at 2 to a lower frame 3. The upper frame comprises four members 4 supporting a grid 5 and carrying a handle 6. The lower frame 3 comprises two end members 7 having posts 8 carrying parallel lower support members 9 in the form of strips and a side member 10 carrying a second handle 11. The end members 7 also carry spring loaded catches 12 which locate in apertures 13 in members 4 when the two frame parts are pivoted together.

The grid 5 comprises ten parallel longitudinal grid members 14 in the form of strips and eight interlocking parallel transverse grid members 15 in the form of strips extending at right angles to members 14. The grid members have notched ends, as illustrated at 16 for example, which extend down recesses 17 in frame members 4 with the notches engaging a ledge 18.

The lower support members 9 are mounted to the posts 8 by means of slots 19 engaging lugs 20 on the posts, so as to allow for thermally induced movements. The lower support members 9 are arranged in pairs, with one member beng mounted on each side of a post 8. Each support member is provided with four pairs of upwardly directed projections 21 along its length.

The construction and operation of the above carrier will become more readily apparent from the detailed description of the carrier of Figs 2 to 8 which is identical in all respects save as to the number of components handled, which in this case is thirty six. Thus the carrier has twelve longitudinal grid members 14, twelve transverse grid members 15, and six pairs of lower support members 9 each with six pairs of projections 21. Like numerals are used for like parts in this embodiment.

Figure 2:
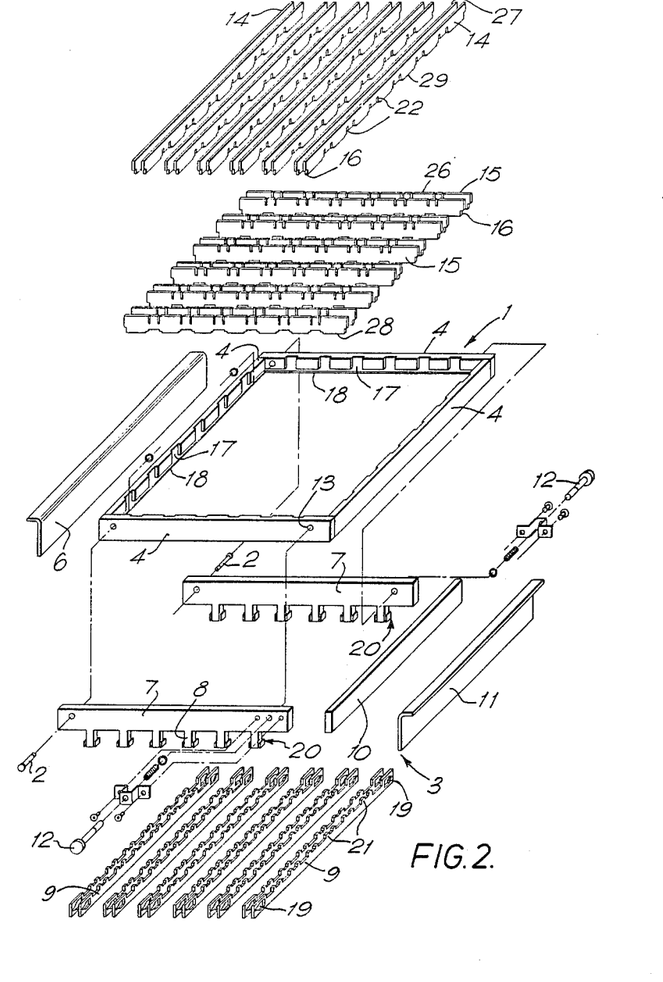
FIG. 2 is an exploded view of a carrier identical to that of FIG. 1, save that it is adapted to carry thiry six PLCC's.
Figure 3:
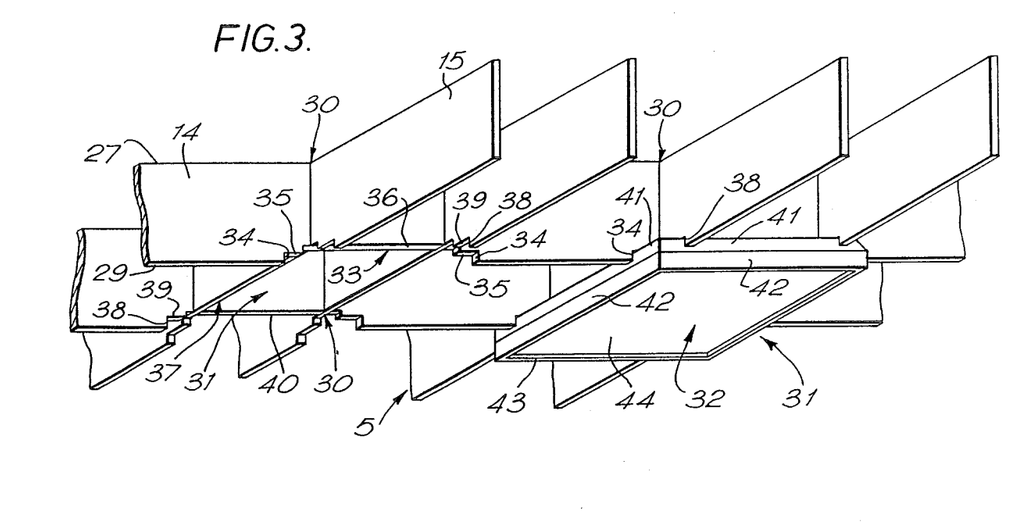
FIG. 3 is an underneath view of part of the upper grid of the apparatus of FIG. 2, with a PLCC in place.

As can be seen, each longitudinal grid member 14 is provided with pairs of downwardly open slots 22 whose ends 23 are positioned halfway down the depth of the members 14. Likewise, each transverse grid member 15 is provided with corresponding upwardly open slots 24 whose ends 25 are positioned halfway down the depth of the members 15. Thus, the members 14 and 15 can be slotted together to form a rectangular grid of the same type as grid 5 shown in FIG. 1, with upper surfaces 26 and 27 being flush and lower surfaces 28 and 29 also being flush. Reference is made to FIG. 3 which shows how the interlocking of slots 22 and 24 defines points of intersection 30. The arrangement is such in the rectangular grid 5 so formed, alternate rectangles in any direction define zones 31 to receive components 30 and in this embodiment the zones 31 are square.

Figures 4, 5:
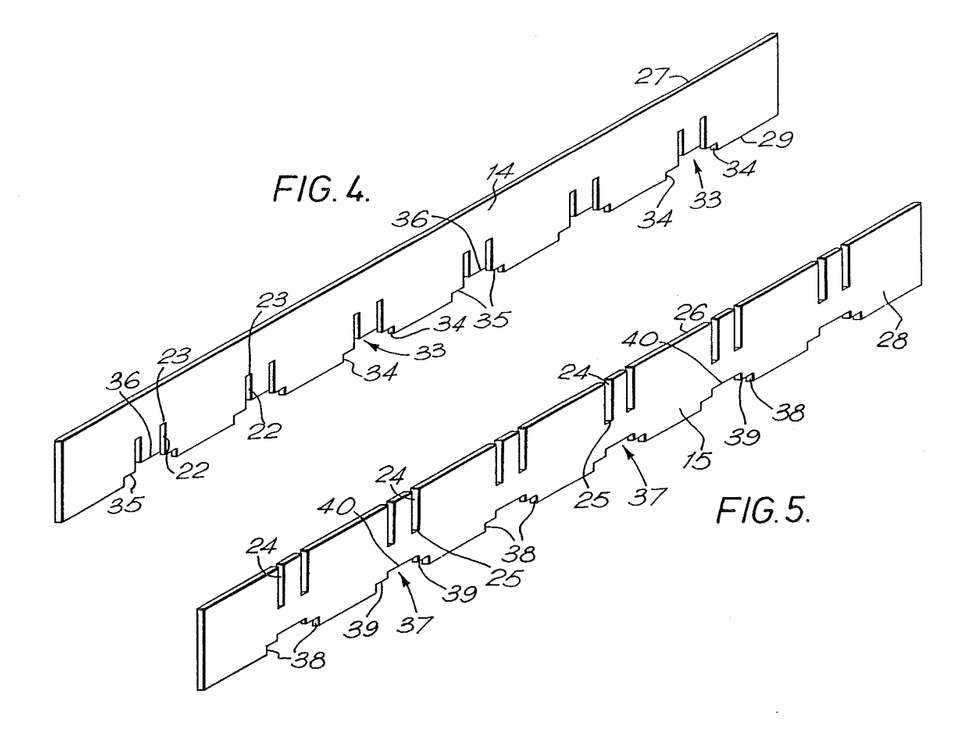
FIG. 4 is an enlarged perspective view of one of the grid members of the carrier of FIG. 2.
FIG. 5 is an enlarged perspective view of another of the grid members of the carrier of FIG. 2.

As shown more clearly in FIG. 4, the lower surface 29 of grid member 14 is provided with a plurality of recesses 33. The ends of the recesses define facing abutments 34, which are outside of the slots 23 which define the points of intersection 30 in the grid 5. The recesses 33 are stepped at 35 and have bases 36 which extend between the slots 23, the steps 35 extending only to the margins of the slots 23.

Similarly, as shown in FIG. 5, the lower surface 28 of grid member 15 is provided with a plurality of recesses 37. The ends of these define facing abutments 38 which are outside of the projection of slots 24 and thus the points of intersection 30 in the grid 5. The recesses 37 are stepped at 39 and have bases 40 which extend between the projections of the slots 24, the steps 39 extending only to the margins of the slots 24.

The recesses 33 and 37 are of the same size and shape, with pairs of abutments 34 and pairs of abutments 38 being spaced by identical distances. Steps 35 and 39 are at the same depth, as are bases 36 and 40.

Thus, in the grid 5, each zone 31 has at its four corners, outside of the points of intersection 30, one step 35 with an associated abutment 34, and one step 39 with an associated abutment 38. The remainders of the members 14 and 15 in the zone 31 are recessed upwardly, being formed by bases 36 and 40 of the recesses 33 and 37.

Thus, when a component 32 is positioned in the zone 31, it engages only the four steps 35 and four steps 39, and is located laterally by abutments 34 and 38.

In this embodiment, the component 32 is a square PLCC having edge portions 41 which are free of contacts and can engage the abutments 34 and 38. The PLCC has contacts in regions 42 on each side, the contacts extending over a ridge 43 so as to stand proud of the lower face 44 of the PLCC.

The area of contact with the upper face of the PLCC is only that of the steps 35 and 39, whilst the PLCC is effectively prevented from unwanted movement upwards or laterally.

To restrict downwards movement, the lower faces 44 of the PLCC's 32 are engaged by the projections 21 of the lower support members 9. In this arrangement, two pairs of projections 21, one pair from each of two adjacent support members 9, will engage the lower face 44 of a PLCC so as to provide good stability. Thus the area of contact with the lower face 44 is four times the area 45 of each projection 21 and thus can be minimised whilst providing the required stability.

Figures 6, 7:
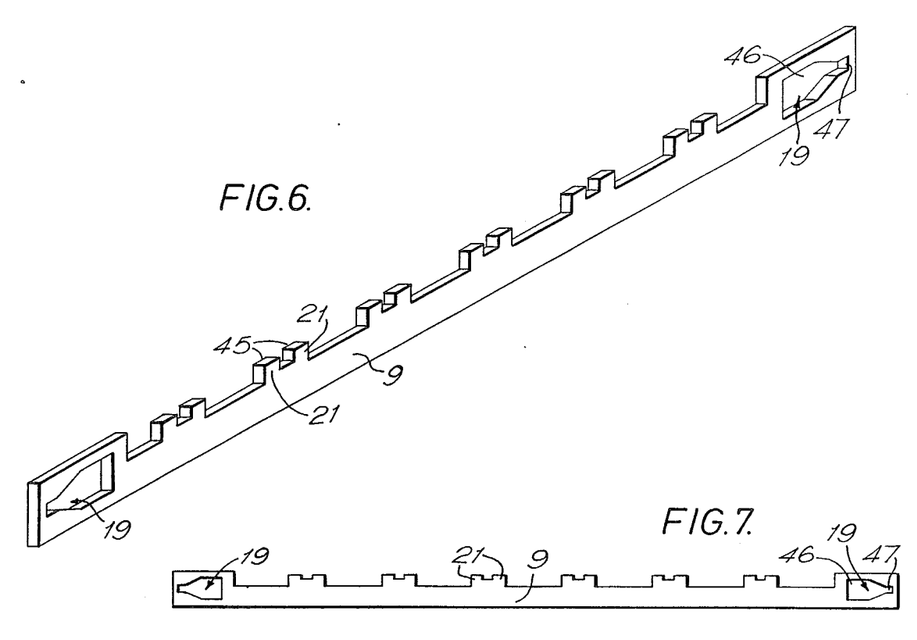
FIG. 6 is an enlarged perspective view of a lower support member of the carrier of FIG. 5.
FIG. 7 is a side view of the member of FIG. 6.
Figures 8A, 8B, 9:
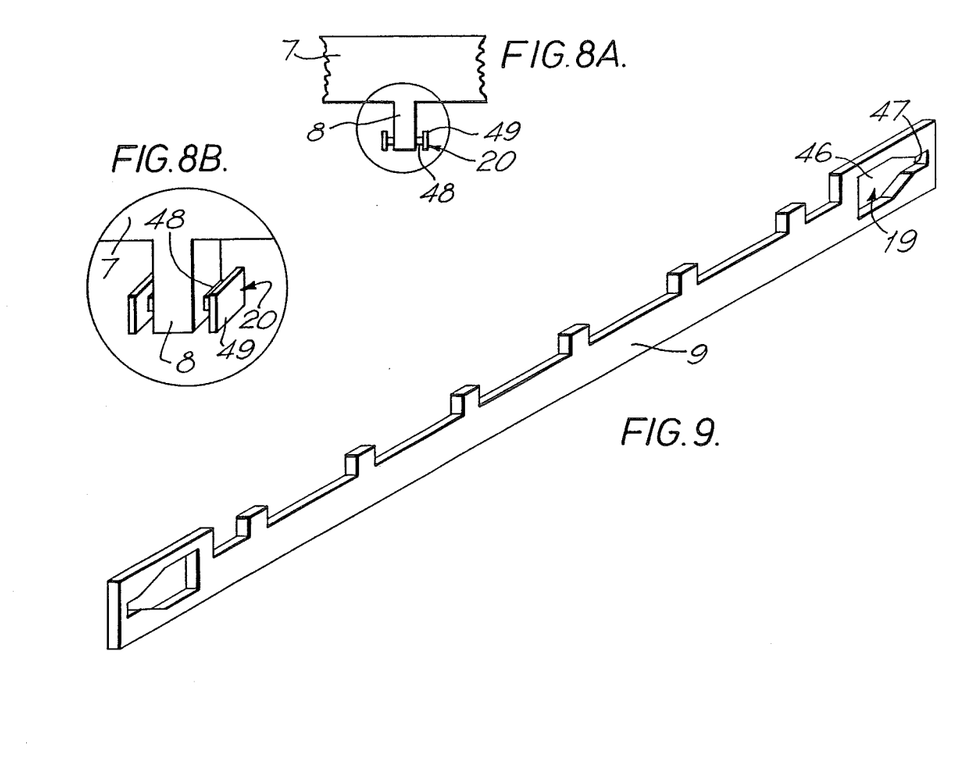
FIG. 8A is an enlarged view of part of a frame member of the carrier of FIG. 2
FIG. 8B is an enlarged perspective view of the same part.
FIG. 9 is a perspective view of a lower support member in an alternative embodiment of carrier.

As shown more clearly in FIGS. 6 and 7, each support member 9 has the aperture 19 at either end shaped so as to have a large portion 46 and a small portion 47. As shown in FIGS. 8A and 8B, the posts 8 have the lugs 20 shaped so as to have a relatively thin portion 48 and a relatively large flange 49. To assemble a support member 9 to the lugs 20, the enlarged portion 46 of the aperture 19 is pushed over the flange 20 and then the member 9 moved relative to post 8 to slot portion 47 of the aperture 19 over the thin portion 28 of the lug 20. The flange 49 prevents lateral escape of the member 9 and once the entire lower frame 3 is assembled the only possible longitudinal movement will be that caused by thermal effects.

Figure 10A:
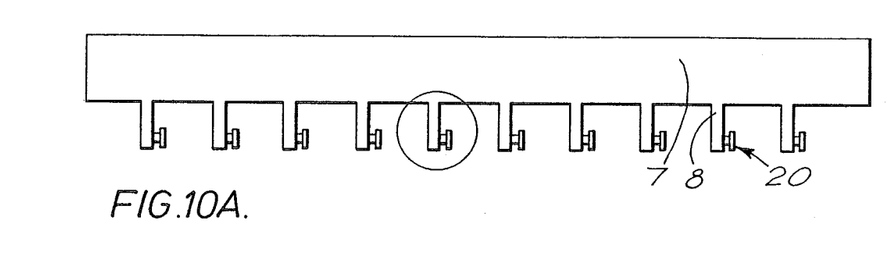
FIG. 10A is an end view of a frame member for use in this alternative embodiment and FIG. 10B is an enlarged perspective view of part of this member.
Figure 10B:
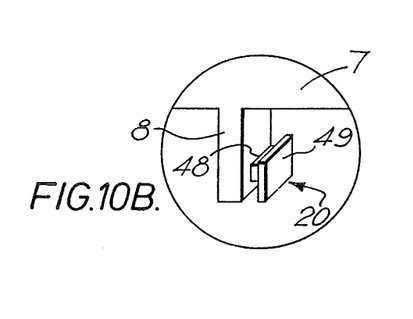

FIGS. 9, 10A and 10B show an alternative arrangement in which only one projection 21 is required for each PLCC 44. Such an arrangement will be adequate where the PLCC's are relatively small and require less support. The posts 8 carry only one lug 20, on one side, and the lower support members 9 have equally spaced projections 21, one for each zone 31 where a PLCC is mounted. In this embodiment, sixty PLCC's can be mounted in the carrier.

In the embodiment of FIGS. 1 and 2, the grid 5 is located in the upper frame 1 by means of notched portions 16 engaging ledges 18 around the bases of the frame members 4, the ends of grid members 14 and 15 passing down recesses 17 in the frame members. Further members (not shown) are then attached to the frame members around the top edges, to prevent upwards movement of the grid 5.

Figure 11:
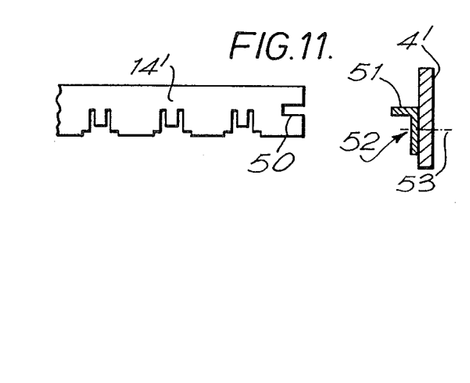
FIG. 11 is a schematic view of an alternative method of mounting a grid member.

In the alternative construction of FIG. 11, a modified grid member 14' has a longitudinally extending slot 50 in each end. This is adapted to engage an outwardly projecting portion 51 of an angle member 52 extending completely around frame members 4' and attached to the frame members e.g. by spot welding at 53. This provides a simple structure which is easily assembled, and which may also allow for a greater degree of thermal expansion to be accommodated readily.

In the use of the embodiments described above, the carrier is inverted and the PLCC's inserted into the grid 5. The frame part 3 is then pivoted so that the projections 21 on members 9 engage the PLCC's also. The frame parts are kept in the closed condition by catches 12 engaging in apertures 13. The carrier is then turned the right way up, and by means of handle 6 can be taken to a position for the soldering processes to be carried out. The carrier will be oriented so that the members 9, which are suspended beneath the rest of the carrier on posts 8, are parallel to the flow of solder so as to present a minimum resistance to flow. After soldering, the reverse procedure is carried out in order to empty the carrier.

It will be appreciated that in all the above arrangements there should be a certain degree of tolerance in dimensions, and that components may not be in engagement with all the appropriate surfaces all of the time.

Whilst particular reference has been made to a carrier for PLCC's in wave soldering, the principles can be applied to other components, other soldering operations, and other fields entirely.

Modifications and variations both to the broad principles and specific structures described may be apparent to those skilled in the art and it is not intended that these should be considered outside of the scope of this disclosure. Notwithstanding this, particular attention is directed to the upper grid structure, to the mounting of the lower support members, and to the combination of these two in a single carrier. All of these aspects are considered to be separately worthy of protection.

I claim:

1. Apparatus for holding electrical or electronic components, comprising a first set of parallel elongate members and a second set of parallel elongate members intersecting the first set so as to form a grid of a plurality of quadrilaterals, the corners of which are the points of intersection and alternate quadrilaterals in any direction constituting a zone for receiving a component, wherein each of the four members defining such a zone is provided with a pair of facing abutments, one outside each of its points of intersection, so as to resist lateral movement of a component positioned in the zone, and between each such pair of abutments is provided at least one portion to restrict vertical movement in the one vertical direction, the carrier also being provided with means to restrict vertical movement in the other vertical direction.

2. Apparatus as claimed in claim 1 wherein there is provided a recessed portion between the facing abutments on each member, to which the abutments are joined by respective steps, the steps providing portions constituting the means to restrict vertical movement of the components in said one vertical direction.

3. Apparatus as claimed in claim 2 wherein each member is provided along its length with a plurality of equally spaced recesses on each side of which is a said step and abutment, the members intersecting between the steps.

4. Apparatus as claimed in claim 1 wherein the grid comprises continuous members which are interlocked.

5. Apparatus as claimed in claim 4 wherein the members are interlocked by providing one set of members with downwardly facing slots for half the depth of the members, and the other set of members with upwardly facing slots, again for half the depth of the members.

6. Apparatus as claimed in claim 5 wherein the members are thin strips.

7. Apparatus for holding electrical or electronic components including means for holding a plurality of components in an array and restricting them against movement in lateral directions and in one vertical direction, wherein means for restricting vertical movement in the other vertical direction comprises a plurality of parallel elongate members each provided along its length with a plurality of projections adapted to engage the components and each mounted to a frame by means of a lug and slot arrangement allowing for thermal expansion, and wherein the elongate members are provided with slots having enlarged portions which can be moved over the heads of the lugs and narrower portions which, on relative movement of the lugs and members during assembly, will locate the members whilst providing sufficient room for thermal expansion.

8. Apparatus as claimed in claim 7 wherein the projections are grouped in pairs longitudinally so that in each pair one projection is positioned on each side of a component.

9. Apparatus as claimed in claim 8 wherein the projections are grouped in pairs laterally.

10. Apparatus as claimed in claim 9 wherein the laterally grouped pairs are provided by pairs of elongate members each mounted to the frame by said lug and slot arrangement.

11. Apparatus as claimed in claim 7 wherein the elongate members are mounted on posts which project downwardly from the frame members.

12. Apparatus as claimed in claim 7 wherein the means for holding the plurality of components in an array and restricting them against movement in lateral directions and in the said one vertical direction, comprises a first set of parallel elongate members and a second set of parallel elongate members intersecting the first set so as to form a grid of a plurality of quadrilaterals, the corners of which are the points of intersection and alternate quadrilaterals in any direction constituting a zone for receiving a component, wherein each of the four members defining such a zone is provided with a pair of facing abutments, one outside each of its points of intersection, so as to resist lateral movement of a component positioned in the zone, and between each such pair of abutments is provided at least one portion to restrict vertical movement in the one vertical direction.

13. Apparatus as claimed in claim 12 wherein the said one vertical direction is the upwards direction.

14. Apparatus for holding electrical or electronic components including means for holding a plurality of components in an array and restricting them against movement in lateral directions and in one vertical direction, wherein means for restricting vertical movement in the other vertical direction comprises a plurality of parallel elongate members each provided along its length with a plurality of projections adapted to engage the components and each mounted to a frame by means of a lug and slot arrangement allowing for thermal expansion, wherein the means for holding the plurality of components in an array and restricting them against movement in lateral directions and in the said one vertical direction, comprises a first set of parallel elongate members and a second set of parallel elongate members intersecting the first set so as to form a grid of a plurality of quadrilaterals, the corners of which are the points of intersection and alternate quadrilaterals in any direction constituting a zone for receiving a component, wherein each of the four members defining such a zone is provided with a pair of facing abutments, one outside each of its points of intersection, so as to resist lateral movement of a component positioned in the zone, and between each such pair of abutments is provided at least one portion to restrict vertical movement in the one vertical direction.

15. Apparatus as claimed in claim 14 wherein the said one vertical direction is the upwards direction.

16. Apparatus for holding electrical or electronic components whilst being moved through a solder bath, including means for holding a plurality of components in an array and restricting them against movement in lateral directions and in the upwards vertical direction, wherein means for restricting vertical movement in the downwards vertical direction comprises a plurality of parallel elongate members each provided along its length with a plurality of projections adapted to engage the components and each mounted to a frame by means of a lug and slot arrangement allowing for thermal expansion, wherein the elongate members are mounted on posts which project downwardly from the frame and the elongate members are parallel to the direction of movement through the solder bath.

* * * * *